US008659453B1

(12) United States Patent
Low et al.

(10) Patent No.: US 8,659,453 B1
(45) Date of Patent: Feb. 25, 2014

(54) DIGITAL RADIO FREQUENCY MEMORY UTILIZING TIME INTERLEAVED ANALOG TO DIGITAL CONVERTERS AND TIME INTERLEAVED DIGITAL TO ANALOG CONVERTERS

(75) Inventors: Nathan E. Low, Liverpool, NY (US); Shawn Walters, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 85 days.

(21) Appl. No.: 13/082,167

(22) Filed: Apr. 7, 2011

(51) Int. Cl.
*H03M 1/00* (2006.01)

(52) U.S. Cl.
USPC ........... 341/110; 341/118; 341/120; 341/141; 341/155

(58) Field of Classification Search
USPC .......... 341/110, 118, 120, 141, 142, 144, 155
See application file for complete search history.

(56) References Cited

U.S. PATENT DOCUMENTS

| | | | | |
|---|---|---|---|---|
| 6,081,215 | A * | 6/2000 | Kost et al. ...................... | 341/120 |
| 6,177,893 | B1 * | 1/2001 | Velazquez et al. ............. | 341/118 |
| 6,380,879 | B2 * | 4/2002 | Kober et al. ................... | 341/155 |
| 6,476,749 | B1 * | 11/2002 | Yeap et al. ..................... | 341/155 |
| 6,483,450 | B2 * | 11/2002 | Boehm et al. ................. | 341/144 |
| 6,653,959 | B1 * | 11/2003 | Song ............................. | 341/131 |
| 6,771,198 | B2 * | 8/2004 | Azadet .......................... | 341/110 |
| 7,049,994 | B2 * | 5/2006 | Tsujita .......................... | 341/161 |
| 7,312,737 | B2 | 12/2007 | Jungerman et al. | |
| 7,372,386 | B1 * | 5/2008 | Maloberti et al. ............ | 341/144 |
| 7,835,478 | B2 * | 11/2010 | Ashish .......................... | 375/350 |
| 2001/0052864 | A1 * | 12/2001 | Shimizu et al. ............... | 341/141 |
| 2003/0132870 | A1 * | 7/2003 | Azadet .......................... | 341/155 |
| 2007/0120724 | A1 * | 5/2007 | Hori et al. ..................... | 341/156 |
| 2008/0150773 | A1 * | 6/2008 | Arais et al. .................... | 341/120 |
| 2012/0075129 | A1 * | 3/2012 | Kidambi ....................... | 341/118 |

OTHER PUBLICATIONS

Christoph Krall et al., Time-Interleaved Digital-to-Analog Converters for UWB Signal Generation; IEEE 2007 Nov. 12, 2007 p. 366-371.

* cited by examiner

*Primary Examiner* — Linh Nguyen
(74) *Attorney, Agent, or Firm* — Howard IP Law Group, PC

(57) ABSTRACT

A digital radio frequency memory (DRFM) comprises a plurality of time interleaved analog to digital converters (ADCs) in cooperation with a plurality of time interleaved digital to analog converters (DACs) to provide an effective sampling rate which may be greater than the clock rate of the system. A higher sampling rate at the ADC increases instantaneous bandwidth, while a higher sampling rate at the DAC improves spectral purity. The ADCs and DACs are time interleaved by supplying a clock signal to each ADC/DAC which is skewed with respect to the previous and subsequent skewed signal. In order to process the higher effective sampling rate, a pre-computation of DAC values for each high rate sample is performed by an SDAC algorithm that pipelines the calculations of the processed sample values provided to the DAC. A DAC bias correction is provided to adjust for drift in the DACs.

15 Claims, 10 Drawing Sheets

| Clock 1 | | Clock 2 | | Clock 3 | | Clock 4 | | Clock 5 | | Clock 6 | |
|---|---|---|---|---|---|---|---|---|---|---|---|
| $Sample_1 - Sample_0$ | $R_1$ | $R_1$ | $R_9$ | $R_9$ | $R_{17}$ | $R_{17}$ | $R_{25}$ | $R_{34}$ | $SDAC_{Prev15}+R_{34}$ | $R_{42}=SDAC_1$ |
| $Sample_3 - Sample_2$ | $R_2$ | $R_2+R_1$ | $R_{10}$ | $R_{10}$ | $R_{18}$ | $R_{18}$ | $R_{26}$ | $R_{35}$ | $SDAC_{Prev15}+R_{35}$ | $R_{43}=SDAC_2$ |
| $Sample_5 - Sample_4$ | $R_3$ | $R_3$ | $R_{11}$ | $R_{10}+R_{11}$ | $R_{19}$ | $R_{19}$ | $R_{27}$ | $R_{36}$ | $SDAC_{Prev15}+R_{36}$ | $R_{44}=SDAC_3$ |
| $Sample_7 - Sample_6$ | $R_4$ | $R_4+R_2$ | $R_{12}$ | $R_{10}+R_{12}$ | $R_{20}$ | $R_{20}$ | $R_{28}$ | $R_{37}$ | $SDAC_{Prev15}+R_{37}$ | $R_{45}=SDAC_4$ |
| $Sample_9 - Sample_8$ | $R_5$ | $R_5$ | $R_{13}$ | $R_{13}$ | $R_{21}$ | $R_{20}+R_{21}$ | $R_{29}$ | $R_{38}$ | $SDAC_{Prev15}+R_{38}$ | $R_{46}=SDAC_5$ |
| $Sample_{11} - Sample_{10}$ | $R_6$ | $R_6+R_5$ | $R_{14}$ | $R_{14}$ | $R_{22}$ | $R_{20}+R_{22}$ | $R_{30}$ | $R_{39}$ | $SDAC_{Prev15}+R_{39}$ | $R_{47}=SDAC_6$ |
| $Sample_{13} - Sample_{12}$ | $R_7$ | $R_7$ | $R_{15}$ | $R_{14}+R_{15}$ | $R_{23}$ | $R_{20}+R_{23}$ | $R_{31}$ | $R_{40}$ | $SDAC_{Prev15}+R_{40}$ | $R_{48}=SDAC_7$ |
| $Sample_{15} - Sample_{14}$ | $R_8$ | $R_8+R_7$ | $R_{16}$ | $R_{14}+R_{16}$ | $R_{24}$ | $R_{20}+R_{24}$ $Retrieve\ Adjustment$ | $R_{32}$ $R_{33}$ | $R_{41}$ | $SDAC_{Prev15}+R_{41}$ | $R_{49}=SDAC_8$ |

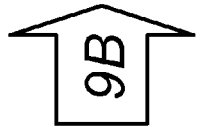

| Clock 1 | Clock 2 | | Clock 3 | | Clock 4 | | Clock 5 | |
|---|---|---|---|---|---|---|---|---|
| Retrieve FIFO$_1$ | R$_1$ | R$_9$-R$_1$ | R$_{17}$ | R$_{17}$ | R$_{25}$ | R$_{25}$ | R$_{33}$ | R$_{41}$ |
| Retrieve FIFO$_2$ | R$_2$ | R$_{10}$-R$_2$ | R$_{18}$ | R$_{17}$+R$_{18}$ | R$_{26}$ | R$_{26}$ | R$_{34}$ | R$_{42}$ |
| Retrieve FIFO$_3$ | R$_3$ | R$_{11}$-R$_3$ | R$_{19}$ | R$_{19}$ | R$_{27}$ | R$_{26}$+R$_{27}$ | R$_{35}$ | R$_{43}$ |
| Retrieve FIFO$_4$ | R$_4$ | R$_{12}$-R$_4$ | R$_{20}$ | R$_{19}$+R$_{20}$ | R$_{28}$ | R$_{26}$+R$_{28}$ | R$_{36}$ | R$_{44}$ |
| Retrieve FIFO$_5$ | R$_5$ | R$_{13}$-R$_5$ | R$_{21}$ | R$_{21}$ | R$_{29}$ | R$_{29}$ | R$_{37}$ | R$_{36}$+R$_{37}$ R$_{45}$ |
| Retrieve FIFO$_6$ | R$_6$ | R$_{14}$-R$_6$ | R$_{22}$ | R$_{21}$+R$_{22}$ | R$_{30}$ | R$_{30}$ | R$_{38}$ | R$_{36}$+R$_{38}$ R$_{46}$ |
| Retrieve FIFO$_7$ | R$_7$ | R$_{15}$-R$_7$ | R$_{23}$ | R$_{23}$ | R$_{31}$ | R$_{30}$+R$_{31}$ | R$_{39}$ | R$_{36}$+R$_{39}$ R$_{47}$ |
| Retrieve FIFO$_8$ | R$_8$ | R$_{16}$-R$_8$ | R$_{24}$ | R$_{23}$+R$_{24}$ | R$_{32}$ | R$_{30}$+R$_{32}$ | R$_{40}$ | R$_{30}$+R$_{40}$ R$_{48}$ |
| SDAC$_1$/32 | R$_9$ | Store in FIFO$_1$ R$_9$ | | | | | | |
| SDAC$_3$/32 | R$_{10}$ | Store in FIFO$_2$ R$_{10}$ | | | | | | |
| SDAC$_5$/32 | R$_{11}$ | Store in FIFO$_3$ R$_{11}$ | | | | | | |
| SDAC$_7$/32 | R$_{12}$ | Store in FIFO$_4$ R$_{12}$ | | | | | | |
| SDAC$_9$/32 | R$_{13}$ | Store in FIFO$_5$ R$_{13}$ | | | | | | |
| SDAC$_{11}$/32 | R$_{14}$ | Store in FIFO$_6$ R$_{14}$ | | | | | | |
| SDAC$_{13}$/32 | R$_{15}$ | Store in FIFO$_7$ R$_{15}$ | | | | | | |
| SDAC$_{15}$/32 | R$_{16}$ | Store in FIFO$_8$ R$_{16}$ | | | | | | |

FIG. 9A

| Clock 6 | | Clock 7 | | Clock 8 | | Clock 9 |
|---|---|---|---|---|---|---|
| $Avg_{-1}(DAC_2) + R_{41}$ | $R_{49}$ | $SDAC_1 - R_{49}$ | $R_{57} = DAC_1(1)$ | $Check\ R_{65} > Threshold$ | $R_{66}$ | (True) Set Adjust to '$R_{67}$', (False) 0 |
| $Avg_{-1}(DAC_2) + R_{42}$ | $R_{50}$ | $SDAC_1 - R_{50}$ | $R_{58} = DAC_1(3)$ | | $R_{67}$ | (True) Restart Counter from 0 |
| $Avg_{-1}(DAC_2) + R_{43}$ | $R_{51}$ | $SDAC_1 - R_{51}$ | $R_{59} = DAC_1(5)$ | $Check\ Counter == 3$ | $R_{68}$ | (True) Reset FIFOs |
| $Avg_{-1}(DAC_2) + R_{44}$ | $R_{52}$ | $SDAC_1 - R_{52}$ | $R_{60} = DAC_1(7)$ | $Check\ Counter == 8$ | $R_{69}$ | (True) Reset DAC Average |
| $Avg_{-1}(DAC_2) + R_{45}$ | $R_{53}$ | $SDAC_1 - R_{53}$ | $R_{61} = DAC_1(9)$ | | | |
| $Avg_{-1}(DAC_2) + R_{46}$ | $R_{54}$ | $SDAC_1 - R_{54}$ | $R_{62} = DAC_1(11)$ | | | |
| $Avg_{-1}(DAC_2) + R_{47}$ | $R_{55}$ | $SDAC_1 - R_{55}$ | $R_{63} = DAC_1(13)$ | | | |
| $Avg_{-1}(DAC_2) + R_{48}$ | $R_{56}$ | $SDAC_1 - R_{56}$ | $R_{64} = DAC_1(15)$ | | | |
| | $R_{56}$ | | $R_{65}$ | | | |

DIGITAL RADIO FREQUENCY MEMORY UTILIZING TIME INTERLEAVED ANALOG TO DIGITAL CONVERTERS AND TIME INTERLEAVED DIGITAL TO ANALOG CONVERTERS

FIELD OF THE INVENTION

The present invention relates to digital signal processing. More particularly, the present invention relates to a digital radio frequency memory (DRFM).

BACKGROUND

Digital radio frequency memory (DRFM) provides a means for receiving and subsequent digital regeneration of a radio frequency (RF) waveform. RF signals are received as analog signals. A DRFM converts the signal to a digital form using analog to digital converters (ADCs). The digital form of the received RF signal may then be stored in memory and processed digitally. Following processing, the digital form of the signal is sent through at least one digital to analog converter (DAC) that returns the signal to an analog form. The output is an analog signal representative of the originally received RF signal.

The waveform may be amplitude and/or frequency modulated and regenerated at a time corresponding with a desired (i.e. target) range offset. Based on these capabilities, a DRFM may be used as a test target generator or as a coherent repeater for example, in electronic warfare (EW) applications.

Conventional DRFMs are typically implemented via commercial off-the-shelf (COTS) converters. Those employing such devices, however, are faced with a tradeoff between bandwidth and spectral purity. As the instantaneous bandwidth of a DRFM increases, the spectral purity of the output decreases, limited by the sampling rate of the COTS ADCs and DACs.

FIG. 1 shows a conventional DRFM solution 100. An RF signal 105 is received at a high or intermediate frequency (IF). An ADC 110 samples the input waveform 105 at a sampling rate attainable by the ADC 110. The ADC 110 converts the analog samples into digital samples 115 for storage in memory 120. Once the digital samples 115 are stored in memory 120, digital processing in the form of a technique application 125 is performed. Technique application 125 may include performing any combination of (but not limited to) a frequency offset, a phase offset, and frequency, phase and/or amplitude modulation.

The technique application 125 receives a clock signal 135 from a DAC 140 which instructs the technique application 125 to send the processed digital samples 130 to the DAC 140. DAC 140 regenerates the original RF signal 145 in an analog form by converting the processed digital samples 130 to analog form in order to regenerate the original waveform 105. DFRM 100 is limited in bandwidth and spectral purity based on the ADC 110 and DAC 140 chosen. For example, the speed at which the ADC 110 may sample the received IF signal 105 may be at a rate that is lower than the frequency of the received signal 105. Thus, the ADC 110 does not support the bandwidth necessary to capture all the changes occurring in the incoming waveform 105. These limitations are carried through the process to the DAC 140, which also limits the degree of spectral purity of the output signal 145 being generated.

Accordingly, a DFRM that overcomes one or more of the above limitations, including the sampling speed of the ADC's and DAC's used to implement the DFRM, and allows for greater instantaneous bandwidth and higher spurious free dynamic range (SFDR), is desirable.

SUMMARY

A digital radio frequency memory (DRFM) comprises a plurality of time interleaved analog to digital converters (ADCs) in cooperation with a plurality of time interleaved digital to analog converters (DACs) to provide an effective sampling rate which may be greater than the clock rate of the system. A higher sampling rate at the ADC increases instantaneous bandwidth, while a higher sampling rate at the DAC improves spectral purity. The ADCs and DACs are time interleaved by supplying a clock signal to each ADC/DAC which is skewed with respect to the previous and subsequent skewed signal. In order to process the higher effective sampling rate, a pre-computation of DAC values for each high rate sample is performed by an SDAC algorithm that pipelines the calculations of the processed sample values provided to the DAC. A sliding window average with feedback is provided to adjust for drift in the DACs.

BRIEF DESCRIPTION OF THE DRAWINGS

A better understanding of the description of the present invention may be had with reference to the accompanying drawings in which like numerals indicate like features and in which:

FIG. 8 shows a SDAC pre-computation algorithm with based on clock cycles that includes a sliding window average adjustment;

FIGS. 9A and 9B show a pipelined sliding window average calculation based on clock cycles.

DETAILED DESCRIPTION

According to an embodiment of the present invention, a DRFM implements multiple time interleaved ADCs and multiple time interleaved DACs in a manner that increases bandwidth and spectral purity. A clock signal applied to each ADC is skewed by a time period of equal fractions of each ADC's sample rate. For example, for a sample rate of 100 MHz per ADC and an arrangement of four ADC's, each clock is skewed by a 400 MHz clock cycle. Each ADC is operable for sampling an input RF signal at a time that is offset by a 400 MHz clock cycle relative to an adjacent ADC. In this manner, the effective sampling rate of the ADCs is increased by a factor of 4, increasing the effective sampling rate to 400 MHz using 100 MHz ADCs. The digital samples output from the ADCs are received by a technique application that processes digital samples relating to a channel associated with each ADC. The technique application processes the samples from each channel in parallel. Processing of the channel samples takes into account the time skew inherent in the samples and makes appropriate adjustments through analog or digital sample time calibration. This may be accomplished through a analog sample clock skew control circuit or through digital interpolation filters. The DACs are time interleaved in a manner similar to the ADCs, thus increasing the number of samples used to reconstruct the output, resulting in higher spectral purity. Because the DACs must receive samples at an effective rate frequently higher than the clock speed of the system platform, it is not possible to pass samples at the effective sampling rate in actual time. Pre-calculation of the DAC inputs is performed to compensate for the time difference between samples.

Figure 1:
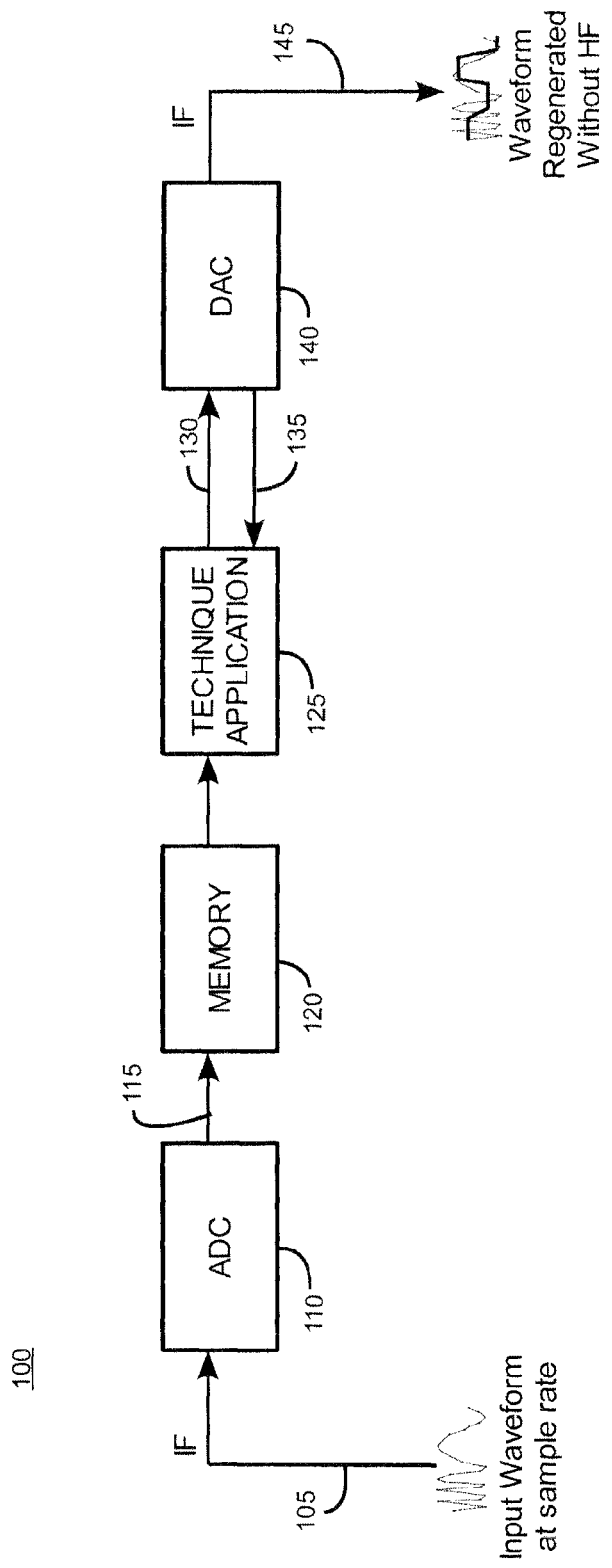
FIG. 1 is a block diagram of a prior art DRFM.
Figure 2:
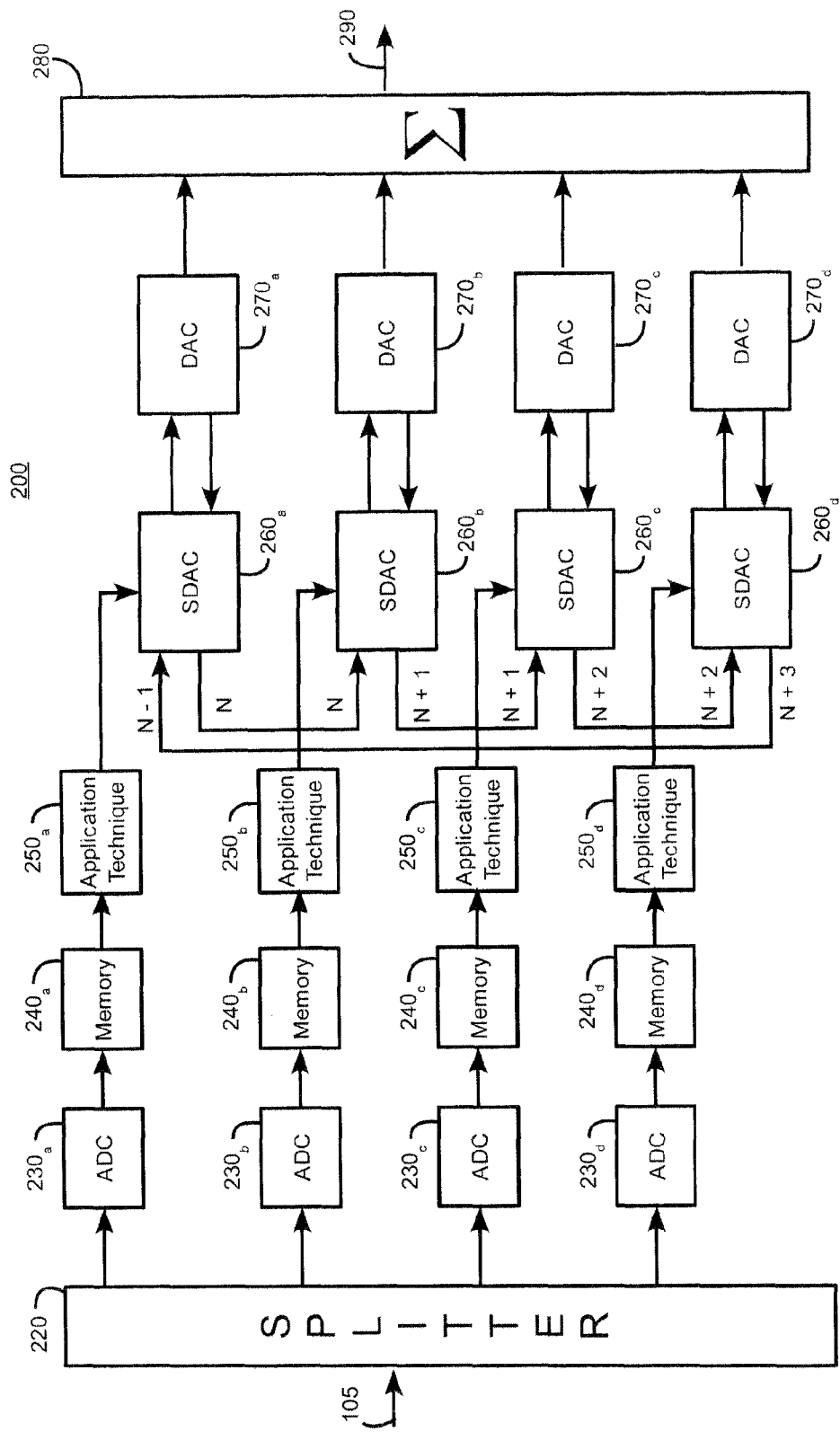
FIG. 2 is a block diagram showing an embodiment of a DRFM.

Referring now to FIG. 2, there is shown a block diagram of an embodiment of the present invention in which a digital radio frequency memory (DRFM) 200 implements coordinated time interleaved Analog to Digital Converters (ADCs) and time interleaved Digital to Analog Converters (DACs) to provide increased bandwidth and spectral purity.

An input radio frequency (RF) signal 105 is received and sent to a splitter 220. The splitter 220 takes the received input RF signal 105 and provides it to a plurality of ADCs $230_a$-$230_d$. While the example described herein shows four ADCs $230_a$-$230_d$, it is understood that other numbers of ADCs 230 may be used. Each ADC 230 samples the input RF signal 105 at a time offset with respect to the other ADCs 230. For example, although all ADCs $230_a$-$230_d$ are controlled by the same clock signal (not shown), ADC $230_a$ samples the input RF signal 105 at a time prior to ADC $230_b$. Similarly, ADC $230_b$ samples the input RF signal 105 a time prior to ADC $230_c$. The time offset is achieved by skewing the clock signal provided to each ADC 230 with respect to the other ADCs 230. The clock signal may be skewed such that the time offset represents 1/n clock cycles, where n represents the number of ADC's 230 utilized.

For example, referring to the embodiment shown in FIG. 2, four ADCs $230_a$-$230_d$ are implemented. Each ADC 230 includes a track and hold circuit for buffering and amplifying the input RF signal 105 during processing. The track and hold circuit (not shown) provides compatibility for a desired bandwidth of input RF signal. If COTS ADCs 230 are used and the track and hold circuits within the ADCs 230 are not compatible with the desired bandwidth, external track and hold circuits (not shown) may be used to buffer and amplify the input rf signal 105 provided to the ADCs 230. Considering that each ADC 230 operates at a clock speed of 100 megahertz (MHz), for each 100 MHz clock cycle, four samples are provided, with each sample evenly spaced within the clock cycle. The time skewed samples result in an effective sampling rate greater than the sampling rate of any single ADC 230. As may be seen by this example, the sampling rate is effectively multiplied by the number of ADC's 230 used. In this example, using four 100 MHz ADCs $230_a$-$230_d$ results in an effective sampling rate of 400 MHz. Due to this higher effective sampling rate, input RF signal 105 may be processed at wider bandwidths than a bandwidth achievable by a single ADC 230. In cases where input RF signal 105 contains high frequency information (such as a 400 MHz signal) a conventional 100 MHz ADC is not capable of capturing enough samples to adequately process the input RF signal 105 as a 400 MHz signal. However, using the 400 MHz effective sampling rate achieved by the DFRM of the illustrated embodiment, such an input signal may be processed at its full frequency. When using COTS converters, it is assumed that the track and hold circuit within each converter is compatible with the desired analog bandwidth. In a case where COTS converters are not themselves compatible, external track and hold circuits (not shown) may be configured to accomplish the full bandwidth.

The samples provided at each ADC $230_a$-$230_d$ are time interleaved with respect to each other. As each sequential data sample is obtained from input RF signal 105, subsequent samples are obtained by the next ADC 230 from the perspective of the prior sample. For example, ADC $230_a$ will sample the input RF signal 105 and take samples 1, 5, 9, 13 and so on. ADC $230_b$ will sample input RF signal 105 at samples 2, 6, 10, 14 and so on. Similarly ADC $230_c$ and $230_d$ will sample the input RF signal 105 at samples 3, 7, 11, 15, . . . , and samples 4, 8, 12, 16, . . . , respectively. Therefore, the samples processed by ADCs $230_a$-$230_d$ are time interleaved and reassembled when the DRFM 200 creates its final analog output 290.

Each ADC $230_a$-$230_d$ stores the data samples in a dual port memory $240_a$-$240_d$. The digital samples stored in memory $240_a$-$240_d$ are read and passed to an application technique $250_a$-$250_d$.

Application technique $250_a$-$250_d$ process the digital samples stored in memory $240_a$-$240_d$ according to known algorithms. By way of example, processing may include any combination of a time, frequency, phase, or amplitude modulation, Frequency modulations, amplitude modulations and/or phase modulations may be performed for samples received in the input RF signal 105. The application technique $250_a$-$250_d$ is applied in parallel to the digital samples provided by each ADC $230_a$-$230_d$ channel. The individual application technique 250 processes samples accounting for the time skew used at each ADC 230 channel and processes the samples appropriately for each sample's specific circumstances.

The processed signal from the application technique $250_a$-$250_d$ is applied to a SDAC block $260_a$-$260_d$. The SDAC 260 provides the next output sample to be processed by the DAC $270_a$-$270_d$. To provide the next sample for a DAC 270 to process, the SDAC 260 associated with that DAC 270 updates the previous value of the DAC based on the current sample as compared with the previous sample processed. The operation of the SDAC 260 is described with reference to FIG. 3.

Figure 3:
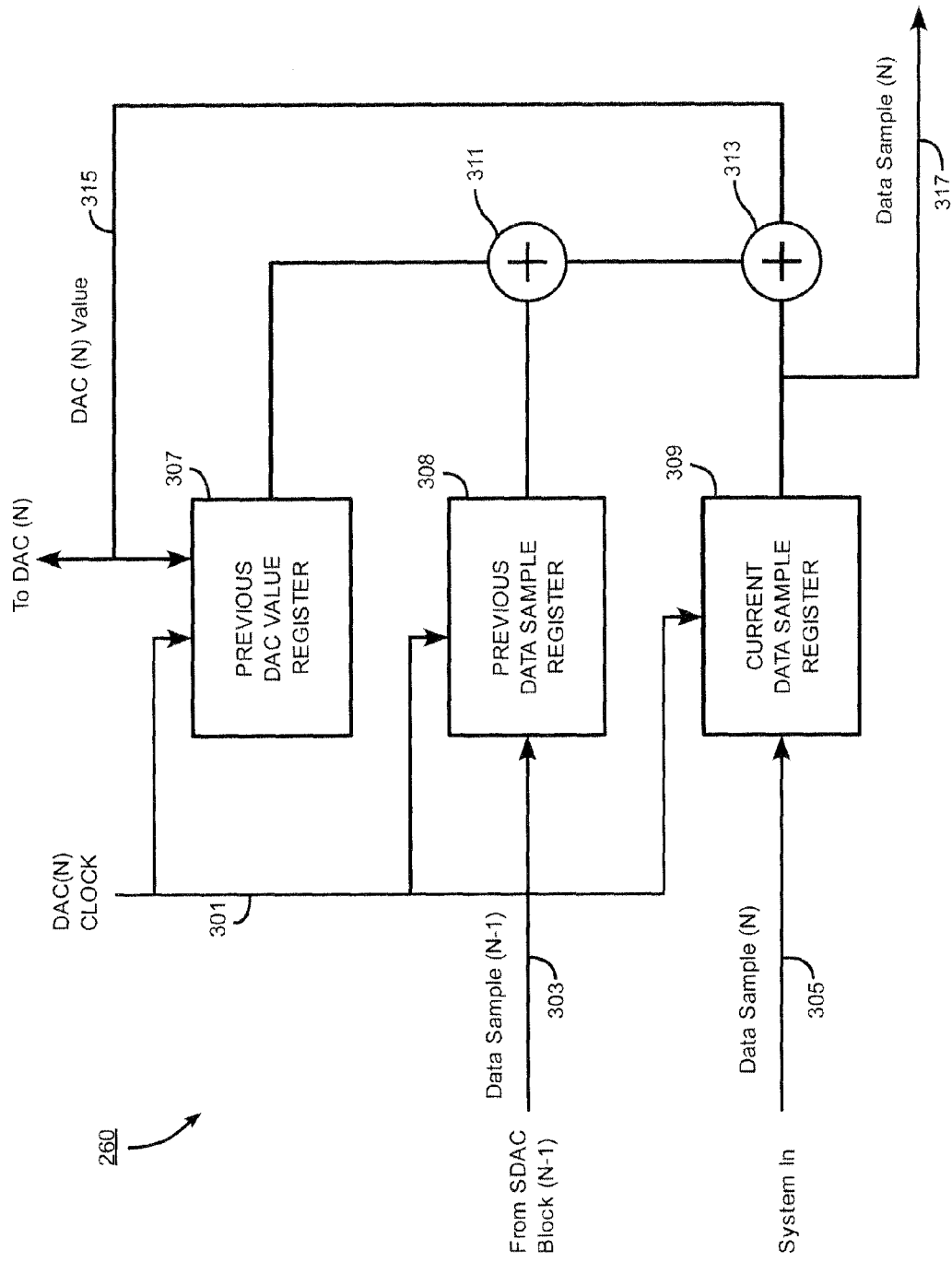
FIG. 3 is a block diagram of an embodiment of an SDAC block.

FIG. 3 is a block diagram depicting the operation of a SDAC $260_N$ block. A clock signal 301 from $DAC_N$ is applied to a previous DAC value register 307, a previous data sample register 308, and a current data sample register 309. As may be seen with reference to FIG. 2, each SDAC block 260 receives a current processed sample as well as a previous processed sample. For example, SDAC $260_b$ receives a current processed sample from application technique $250_b$. In addition, $SDAC_b$ also receives a previous processed sample from SDAC $250_a$ labeled as N. $SDAC_b$ is thus processing sample N+1 as a current sample. $SDAC_b$ processes sample N (the previous sample) and N+1 (the current sample) and then passes its current sample N+1 to SDAC $260_c$ as SDAC's $260_c$ previous processed sample, and so on.

Returning to FIG. 3, which shows sample N as the current sample, the current data sample 305 is received from an application technique $250_N$ associated with this SDAC block $260_N$. The current data sample 305 is stored in the current data sample register 309. The previous data sample 303 representing sample N−1 is stored in previous data sample register 308. The clock signal 301 is received indicating the DAC is ready for data. The previous DAC value register 307 containing the previous value output from SDAC $260_N$ is taken and the previous data sample 303 retrieved from previous data sample register 308 and subtracted from the previous DAC value 307 by subtractor 311. The current data sample 305 is retrieved from the current data sample register 309 and added to the result of the subtraction 311 by adder 313. Thus, the difference between the previous sample and the current sample is used to update the previous value output by the SDAC $260_N$. In order to provide the current data sample 305 as a previous data sample to the next SDAC block $260_{N+1}$, the current data sample 305 is retrieved from current data sample register 309 and passed to $SDAC_{N+1}$ 317. The computed updated value 315 is then passed to the DAC $270_N$ and stored in the previous DAC value register 307 to be updated when the next sample for $SDAC_N$ is received.

Returning now to FIG. 2, the output of SDAC $260_a$-$260_d$ is output to DAC $270_a$-$270_d$ as described above in regards to FIG. 3. DACs $270_a$-$270_d$ are time interleaved with respect to one another in a manner similar to that described above regarding the ADCs $230_a$-$230_d$. The analog outputs of DACs $270_a$-$270_d$ are passed to combiner 280 where they are de-interleaved and output as the output signal 290 representative of the original received input RF signal 105. Time interleaving the DACs $270_a$-$270_d$ provides higher spectral purity in the output signal 290, relative to COTS converters designed to operate at the full effective sample rate without interleaving, as the additional samples taken as a result of the higher effective sampling rate in the ADCs $230_a$-$230_d$ are processed and output to the analog output 290. This processing provides a more precise approximation of the original received input RF signal 105 than achievable with a non-interleaved COTS converter.

Figure 4:
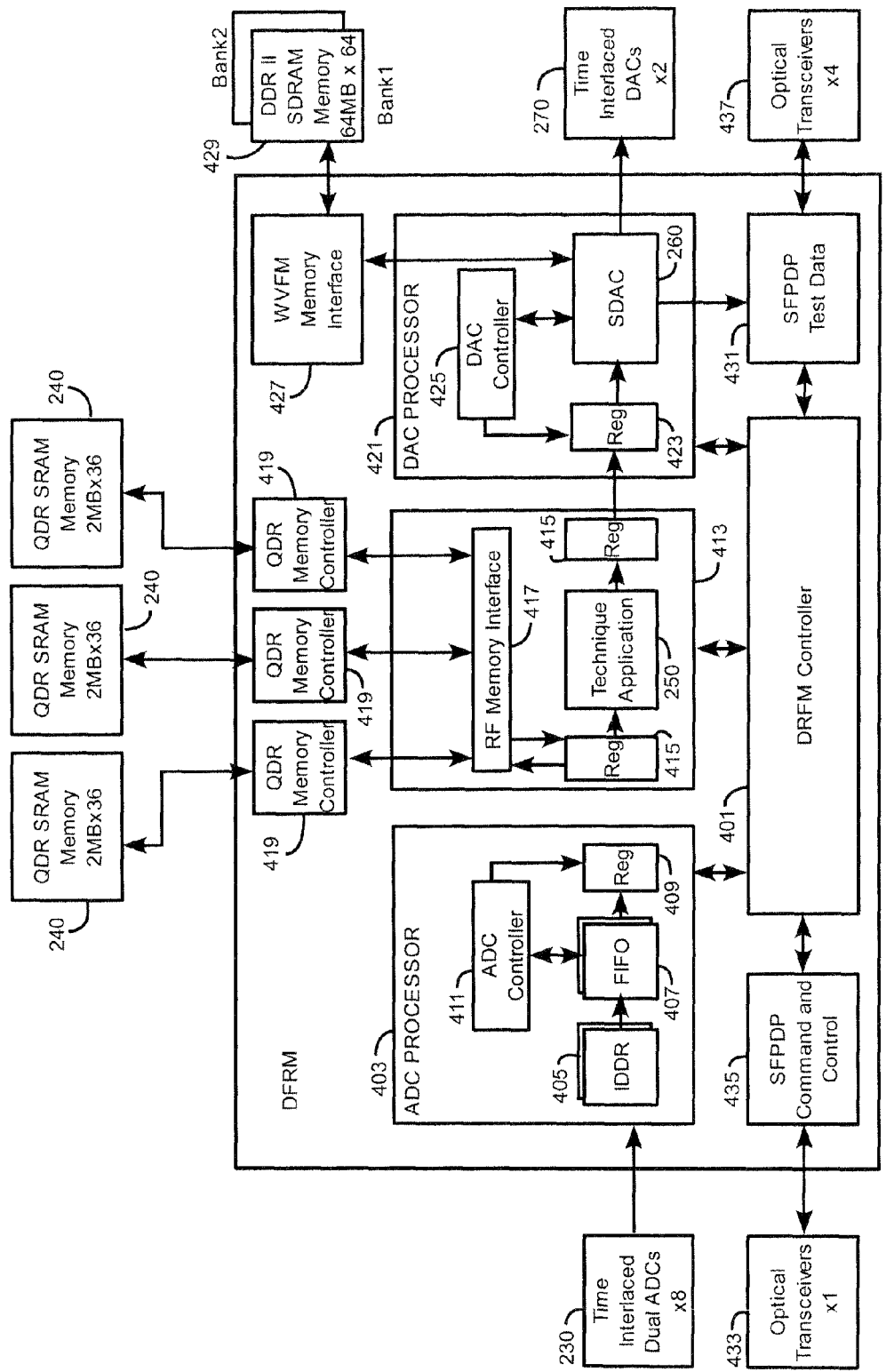
FIG. 4 is a block diagram of an embodiment of a DRFM.

FIG. 4 is a high-level block diagram of an embodiment of a DRFM. The DRFM is controlled by a DRFM controller 401 which communicates with an ADC processor 403, the technique application processor 413 and the DAC processor 421. In addition to these DRFM components, DRFM controller 401 may communicate with other elements of the FPGA such as the serial front panel data port (sFPDP) command and control module 435 and test data module 431 which captures memory snapshots for offline processing. The sFPDP may communicate via high speed data interfaces such as optical transceivers 433, 437. The ADC processor 403 receives time-interleaved digital samples from the time interlaced ADCs 230. ADC processor 403 includes an interface register controller (i.e. IDDR) 405 for sampling the digitized ADC data, a first in first out queue 407 an ADC controller 411 and a register 409.

The technique application processor 413 is adapted to execute the technique application 250 along with an RF memory interface 417, and registers 415 for holding contents of memory 240 controlled through memory controllers 419.

The DAC processor 421 contains the SDAC 260, a DAC controller 425, and register 423. In one embodiment, instead of sending the SDAC output to a DAC 270 directly, the processed digital signals may be stored in waveform memory 429 via waveform memory interface 427. The waveform memory 429 may be used to capture and store the processed digital signal for later recall such as for post-processing activities or other uses. The SDAC 260 may additionally or alternatively send the processed digital samples to a DAC 270 for converting the processed digital signals back into an analog form representative of the originally received RF input signal.

In one embodiment, the DRFM is implemented in a field programmable gate array (FPGA). The implementation of time interleaved ADCs interoperating with time interleaved DACs presents challenges particularly from the perspective of an FPGA environment. For example, the higher effective sampling rate achieved with the time interleaved ADCs may exceed the clock speed of the FPGA. As a result, the interactions between the SDAC blocks, which must occur at the full effective sample rate, cannot be achieved in hardware. This may be addressed through a pipelined approach using pre-computations addressed in a SDAC solution which may be achieved without significant timing issues.

Figure 5:
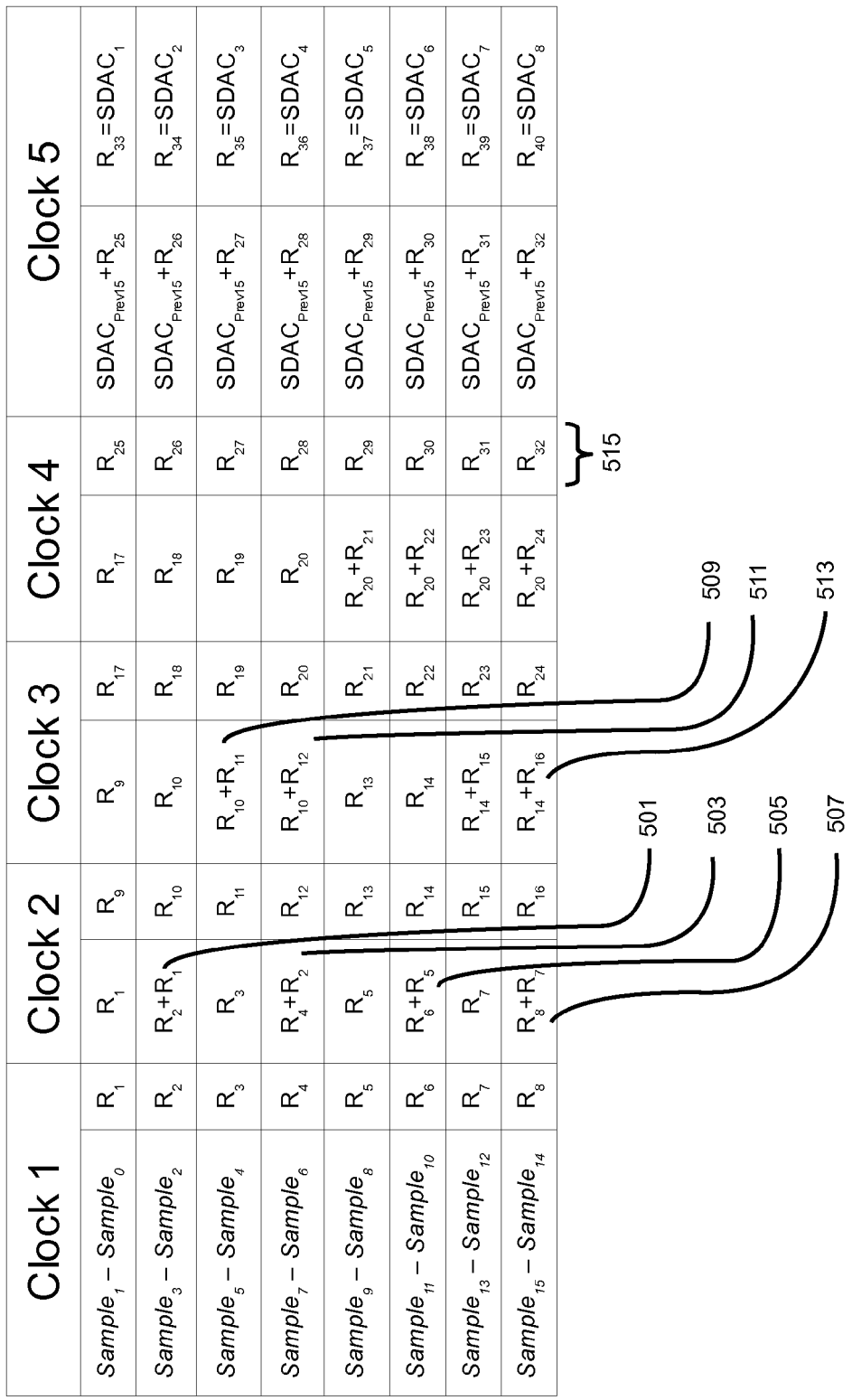
FIG. 5 shows a SDAC pre-computation algorithm based on clock cycles.

FIG. 5 represents a tabular illustration of a pipelined pre-computation algorithm for SDAC 260 according to an exemplary embodiment of the present invention. FIG. 5 depicts 16 received samples ($Sample_1$-16) and 8 SDAC outputs ($SDAC_{1-8}$) generated over 5 clock cycles. In the first column, the 16 samples representing the eight DACs' current and previous samples are received on clock 1's rising edge. The difference of each sample and its previous sample is calculated. The result of the subtraction is stored into a register, $R_1$-$R_8$ on the falling edge of clock cycle 1 as shown in the second column of FIG. 5. As described hereinabove, each SDAC updates the previous DAC value with the difference between the current sample and the previous sample. In the example shown in FIG. 5, the current values are represented as $Sample_1$, $Sample_3$, $Sample_5$, $Sample_7$, $Sample_9$, $Sample_{11}$, $Sample_{13}$, and $Sample_{15}$.

In third column, representing the rising edge of clock 2, the differences relating to $sample_3$ and $sample_1$ (the first two rows) are added together ($R_2$+$R_1$) 501. In this clock cycle, the differences for $sample_7$ is added to the difference for $sample_5$ 503, the difference for $sample_{11}$ is added to the difference for $sample_9$ 505, and the difference for $sample_{15}$ is added to the difference for $sample_{13}$ 507. The results of the additions are applied to registers $R_9$-$R_{16}$ during the falling edge of clock 2. It should be noted that differences calculated in the first clock cycle for $sample_1$, $sample_5$, $sample_9$ and $sample_{13}$ are carried through to their respective registers, $R_9$, $R_{11}$, $R_{13}$, and $R_{15}$.

Additional processing occurs on the third clock cycle (Clock 3). In particular, the sum of the differences of $sample_3$ through $sample_1$ are added to the difference for $sample_5$ 509. The sum calculated in the second clock cycle for the differences for $sample_7$ and $sample_5$ are now added to the sum of differences calculated in clock 2 for $sample_3$ and $sample_1$ 511. Similar calculations are performed to calculate the interim values for $sample_{15}$ and $sample_{13}$ 513.

During the fourth clock cycle (Clock 4), represented by the seventh and eighth columns in the table of FIG. 5, the remainder of the interim values are calculated. Register $R_{20}$ contains the value resulting from the sum of the differences of $sample_1$, $sample_3$, $sample_5$, and $sample_7$. The result stored in $R_{20}$ is added to the interim results calculated for $sample_9$, $sample_{11}$, $sample_{13}$, and $sample_{15}$ 505, 507, 513 to calculate the final adjustments for all samples 515.

A result of the processing performed during clocks 1-4 is a cumulative difference calculated between the last SDAC value and each current sample. For example, the final adjustment for $sample_{15}$, shown as $R_{32}$, is the sum of all the differences between $samples_{1,3,5,7,9,11,13,15}$ and their previous samples 515. With respect to the other samples, the value calculated by clock 4 represents the cumulative change from the previous SDAC to each sample. At clock 5, the previous $SDAC_{Prev15}$ value is applied and added to each cumulative value to calculate a current SDAC value for each sample as shown in the last column of FIG. 5. Thus, the higher effective sample rate at the ADCs is processed in a parallel and pipelined manner, allowing the SDAC output to be generated without unacceptable timing issues.

When processing incoming RF samples, a situation may arise where the incoming signal is a multiple of the DFRM clock speed. When this occurs, each time interleaved ADC samples the input RF signal wave at substantially the same point on the wave at each iteration. The result is that outputs received at the SDAC rapidly build and approach their maximum values (rails) causing the system to produce invalid output.

An ideal solution to this situation is to introduce a zero reset that resets all the SDACs and DACs to zero instantaneously when the signal level exceeds a certain threshold. Using a zero reset based on a properly determined threshold, the SDACs are reset frequently enough to prevent the SDAC values from approaching the rail. However, a zero reset option is not practicable in a hardware implementation. One reason is, that resetting the DACs, which are time interleaved based on a clock skew to each DAC, would require N skewed clock cycles to complete the reset based on N DACs. During the skewed clock resets, the signal generated by the SDACs would be unpredictable.

To mitigate this problem, the system may be configured to reset only when one of the SDAC values reaches a rail. Thus, fewer resets occur and the signal is disrupted less frequently due to the propagation of resets through the DACs. Using the rail reset, the SDACs are all reset to zero when the first SDAC value reaches the rail, taking a full clock cycle (i.e. N skewed clock cycles) for each SDAC block to propagate fully. Such a solution, however, transfigures the resulting waveform for a relatively large portion of time, thus causing a Fast Fourier Transform (FFT) of the DAC output to be incorrect with respect to the original waveform.

In an exemplary embodiment, the SDAC reset problem is addressed by utilizing two output DACs. By using two DACs, each DAC approaches the rails at an equal and opposite pace, corrected with a bias correction algorithm. By way of example, the bias correction algorithm may be accomplished via a sliding window average. This may be achieved due to the fact that COTS DACs are available with faster clock rates than ADCs. Therefore, the effective sampling rate of the ADCs may be rate matched using fewer, higher speed DACs. However, the number of SDAC blocks used remains dependent on the number of ADCs used, as the system clock is not increasing. Since only two SDAC blocks may feed inputs to the DACs at one time, changes to the SDAC algorithm are required and a multiplexer is used to select the correct SDAC block output to direct to the DAC input.

Figure 6:
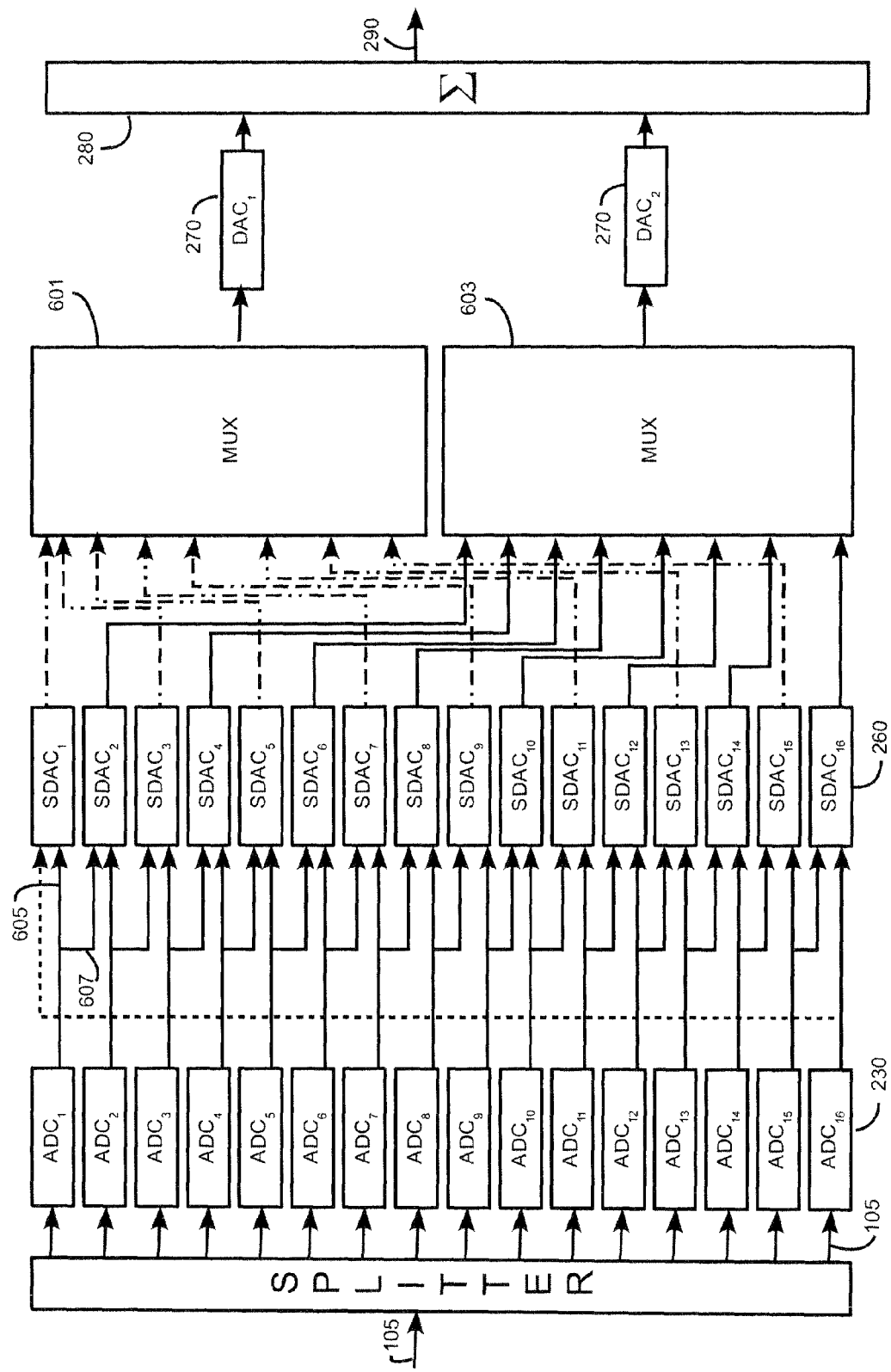
FIG. 6 is a block diagram of an DRFM utilizing two digital to analog converters and 16 analog to digital converters.

FIG. 6 shows a block diagram of a DRFM according to an embodiment of the present invention in which 16 ADCs and 16 SDAC blocks are utilized feeding two DACs. The embodiment shown in FIG. 6 uses 16 ADCs 230 and 16 SDACs 260. The ADCs$_{1-16}$ 230, are time interleaved based on a clock skew such that each successive ADC 230 takes a sample of input RF signal 105 at a time offset with respect to the other ADCs 230. The digital samples from the ADCs 230 are stored in a memory and processed with the desired modulation (not shown). Each processed sample is sent to a corresponding SDAC 260 block as a current sample 605. In addition, each processed sample is set to the next SDAC 260 block to serve as the previous sample 607 as previously described. An SDAC value is generated and passed to a multiplexer (MUX) 601 or 603. By way of example, the SDAC 260 outputs from the even numbered SDAC 260 blocks are directed to MUX 603 while the odd numbered SDAC 260 blocks' outputs are directed to MUX 601. MUX 601, 603 determines which of the SDAC outputs should be input to the corresponding DAC 270. The samples are sent to the DACs 270 to be converted to an analog form. The DACs 270 are time interleaved by skewing the clock signals to each DAC 270 as previously described. The converted analog outputs are combined in combiner 280 to produce an RF output 290 representing the originally received input RF signal 105.

While an embodiment of the present invention utilizing two DACs serves to simplify the bias correction algorithm, correction can be extended to more than two DACs. There may still be situations where the DACs approach the rails and a reset is required. For example, received waveforms whose frequency is over 90% of the Nyquist bandwidth may cause the DAC outputs to approach the rails at an unacceptable rate. A filter may be employed to limit aliasing and reduce this effect. In the case of two DACs, the bias correction algorithm may be implemented as a sliding window average to adjust the SDAC blocks in opposite directions to preserve a zero mean solution in the DACs. The average may be applied to the output of the SDAC either before the signal is fed to the DAC and fed back to the SDAC, or alternatively, the correction may be applied to the signal at the DAC but not the signal fed back to the SDAC. In another embodiment, the correction may be applied against the SDAC but not to the output to the DAC. Applying the adjustment to both the SDAC and the DAC results in a signal that is well adjusted initially, but over time slight oscillations in the DAC outputs cause the output to increase and eventually approach the rail. In another example where the adjustment is applied to the outputs to the DAC only, the values inside the SDAC may be allowed to increase past the rails. However, the adjustment to the DAC inputs keeps the DAC outputs within the range of the DAC (e.g. 14 bits). In an FGPA implementation, the SDAC block is limited by the 48-bit registers resident in the FPGA, and therefore may be allowed to increase well past the limits of the DAC. Eventually, a reset may be necessary at the SDAC. However, such resets are needed infrequently and a sliding window average applied to the input the DAC, maintains the DAC output within an acceptable range. A smaller sliding window may be used for chirp waveforms such that the average is sufficiently large to offset the drift.

Figure 7:
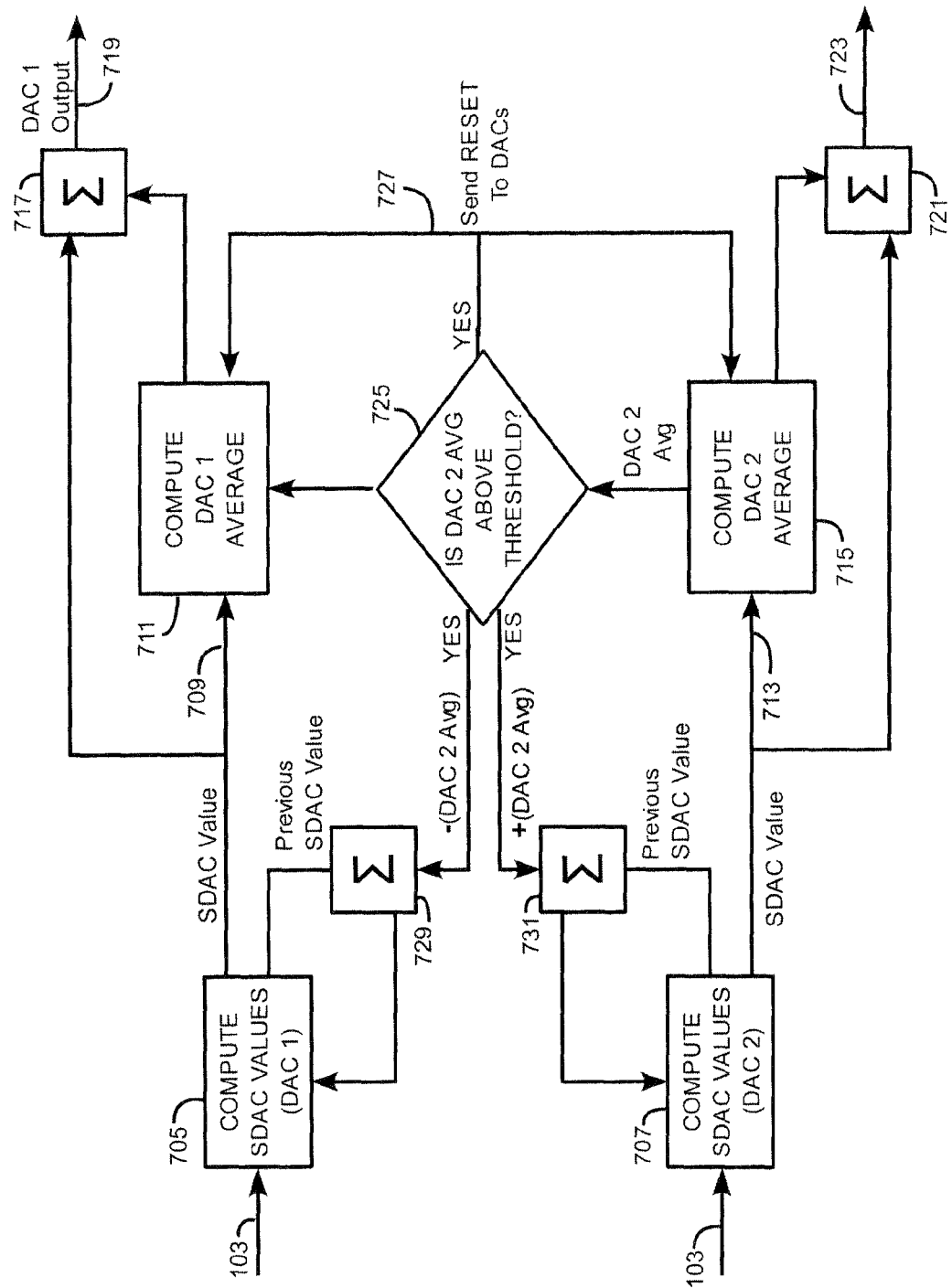
FIG. 7 is a block diagram of a sliding window average correction utilizing a feedback mechanism.

The sliding window average model may be adapted to include a feedback loop to make periodic adjustments to the SDAC blocks in addition to the inputs to the DAC. FIG. 7 is a block diagram showing a sliding window average providing drift adjustment using a feedback mechanism. Samples 103 are received at SDAC for DAC1 705 and the output value of the SDAC 709 is computed. Samples 103 are received at SDAC for DAC2 707 and the output value of the SDAC 713 is computed. The computed value SDAC for DAC1 is then averaged 711. In a similar fashion, the computed SDAC value 713 for DAC2 is computed and averaged 715. The computed average of DAC1 711 is applied and subtracted from the computed SDAC value 709 in subtractor 717 to produce the DAC1 output 719. The average computed for DAC2 715 is applied to the computed SDAC value 713 and subtracted from the SDAC value 713 in subtractor 721 to produce the output value for DAC2 723. The computed DAC2 average 715 is then compared to a threshold 725. If the DAC2 average 715 is above the threshold it triggers the following events. A reset is sent to DAC1 and DAC2 727 to reset the DAC values and prevent the DACs from approaching the rails. In addition, to resetting the DACs, the computed averages for DAC1 and DAC2 711, 715 are applied in opposite directions 729, 731 to the SDAC blocks 705, 707 corresponding to DAC1 and DAC2. For example, when it is determined that the computed average of DAC2 exceeds the threshold 725, the DAC2 average is subtracted from the previous SDAC value that is used as input to the SDAC block 705 by subtractor 729. In contrast to the SDAC 705 adjustment in the negative direction, an equal and opposite adjustment is made to SDAC 707. The computed DAC2 average is added to the previous SDAC value that is used as input to the SDAC block 707 by adder 731. Using a sliding window average adjustment with feedback makes regular sliding window average adjustments to the DAC outputs to prevent the DACs from reaching the rails. This process also provides a means to periodically reset the SDAC blocks to prevent them from approaching the rails as well. As the SDAC blocks drift in equal and opposite directions, applying the computed average in opposite directions to the SDACs for DAC1 and DAC2 maintains a zero mean between the DACs.

The SDAC algorithm is adapted to apply the sliding window average feedback to the SDAC block. Referring to FIG.

8, the SDAC algorithm is shown in tabular form in which a sliding window average with feedback is applied to the SDAC block. The table in FIG. 8 performs SDAC calculations for each received sample in a manner similar to that described in FIG. 5. However, once the sum of the differences for each sample is computed in clock 4, similar to FIG. 5, the computed average (i.e. the adjustment) is also retrieved during clock 4 801. The adjustment value is then applied to each computed sum of differences for each sample in clock 5. As shown in FIG. 8, the adjustment value is stored in register $R_{33}$ at the falling edge of clock 4. In the rising edge of clock 5, the value in $R_{33}$ (i.e. the adjustment value) is added to each computed value for each sample and stored in clock 5. An additional clock cycle (clock 6) as compared with FIG. 5, is used to apply the calculated sample adjustments to all the previous SDAC values and are added in clock 6 to produce the current SDAC values.

To calculate the sliding window average, a pipelined process may be computed similar to that used by the SDAC algorithm. For example, for 16 samples received simultaneously, the averages must be computed simultaneously. To implement this in a pipelined architecture similar to the SDAC algorithm discussed above in FIG. 8, the sliding window average may be expressed as in Equation (1):

$$\text{Average}_{DAC1}(3) = \text{Average}_{DAC1}(-1) + \left(\frac{\text{Sample}_1}{\text{win\_size}} - \frac{\text{Sample}_{1-win\_size}}{\text{win\_size}}\right) + \left(\frac{\text{Sample}_3}{\text{win\_size}} - \frac{\text{Sample}_{3-win\_size}}{\text{win\_size}}\right) \quad \text{Equation (1)}$$

$$\text{Average}_{DAC1}(5) = \text{Average}_{DAC1}(-1) + \left(\frac{\text{Sample}_1}{\text{win\_size}} - \frac{\text{Sample}_{1-win\_size}}{\text{win\_size}}\right) + \left(\frac{\text{Sample}_3}{\text{win\_size}} - \frac{\text{Sample}_{3-win\_size}}{\text{win\_size}}\right) + \left(\frac{\text{Sample}_5}{\text{win\_size}} - \frac{\text{Sample}_{5-win\_size}}{\text{win\_size}}\right)$$

$$\vdots$$

$$\text{Average}_{DAC1}(15) = \text{Average}_{DAC1}(-1) + \left(\frac{\text{Sample}_1}{\text{win\_size}} - \frac{\text{Sample}_{1-win\_size}}{\text{win\_size}}\right) + \left(\frac{\text{Sample}_3}{\text{win\_size}} - \frac{\text{Sample}_{3-win\_size}}{\text{win\_size}}\right) + \left(\frac{\text{Sample}_5}{\text{win\_size}} - \frac{\text{Sample}_{5-win\_size}}{\text{win\_size}}\right) + \left(\frac{\text{Sample}_7}{\text{win\_size}} - \frac{\text{Sample}_{7-win\_size}}{\text{win\_size}}\right) + \left(\frac{\text{Sample}_9}{\text{win\_size}} - \frac{\text{Sample}_{9-win\_size}}{\text{win\_size}}\right) + \left(\frac{\text{Sample}_{11}}{\text{win\_size}} - \frac{\text{Sample}_{11-win\_size}}{\text{win\_size}}\right) + \left(\frac{\text{Sample}_{13}}{\text{win\_size}} - \frac{\text{Sample}_{13-win\_size}}{\text{win\_size}}\right) + \left(\frac{\text{Sample}_{15}}{\text{win\_size}} - \frac{\text{Sample}_{15-win\_size}}{\text{win\_size}}\right)$$

As each sample is received, its contribution to the sliding average since the last average ($\text{Average}_{DAC1}(-1)$), is added to the new average while the oldest value in the sliding window at that point is subtracted $$\left(\frac{\text{Sample}_{1-win\_size}}{\text{win\_size}}\right).$$

Each consecutive sample may be viewed as an accumulation of the adjustments to the sliding average that came before. The cumulative average adjustments may then be added to the previous average ($\text{Average}_{DAC1}(-1)$) to compute each successive sliding window's average.

FIGS. 9A and 9B show the pipelined architecture for computing the sliding window average with feedback as described in FIG. 7. FIG. 9A depicts clock cycles 1-5 and shows the manner in which the average adjustments for each sample is accumulated. The operation is similar to the SDAC algorithm described in FIG. 8. Referencing FIG. 9B, clock cycles 6-9 are now described. The new sliding window average is computed by adding the accumulated adjustments for each received sample to the previous average in accordance with Equation (1). This is shown on the rising edge of clock 6 in the non-shaded column. At the rising edge of clock 7, the computed sliding window averages are subtracted from the SDAC outputs and the total accumulated sliding window average, denoted $R_{56}$ is retained in memory $R_{65}$. In clock 8, the total accumulated average $R_{65}$ is compared to the threshold to determine if the average has exceeded the threshold. 901. Counters are also maintained to determine when adjustment and resets have been propagated through the system. The counters are checked 903, 905 during clock cycle 8. If the counter is equal to 3 903, the FIFOs have been processed and may reset in clock cycle 3. If the clock cycle is equal to 8, 905, the SDACs are finished processing and the DAC average may be reset in clock cycle 8. The resets of the FIFOs and the DAC average occur in clock cycle 9. When the sliding window average exceeds the predetermined threshold 901, the adjustment is stored in $R_{67}$ and the counter is reset to zero. If the threshold is not exceeded the adjustment is set to zero.

The described embodiments are given by way of example to provide an understanding of the present invention and are not meant to be limiting. It may be recognized by one skilled in the art that minor adjustments, changes and substitutions may be made to the described embodiments without departing from the spirit and scope of the present invention.

What is claimed is:

1. A digital radio frequency memory (DRFM) comprising:
   a splitter configured to receive and distribute an RF signal;
   a plurality of analog to digital converters (ADCs) coupled to said splitter, each ADC defining a channel and each of said plurality of ADCs being time interleaved;
   a clock circuit configured to produce a plurality of clock signals, wherein each clock signal is applied to each of the plurality of ADCs at a time different than a time the clock signal is applied to each other ADC to time interleave the plurality of ADCs;
   a plurality of SDAC circuits, each SDAC circuit coupled to an output of a corresponding ADC for processing digital samples belonging to the channel defined by the corresponding ADC, wherein each SDAC circuit comprises:
   a digital to analog converter (DAC) value register configured to store a previous value output by the plurality of SDAC circuits;

a previous data sample register configured to store a previous digital data sample processed by at least one other of the plurality of SDAC circuits in at least one other channel; and a current data sample register configured to store a data sample from the corresponding ADC associated with the channel of the given SDAC circuit, and wherein each SDAC circuit outputs a DAC value calculated by adding a sum of the previous and current data samples to the previous DAC value; and wherein the plurality of SDAC circuits compute the corresponding output value and previous data sample in parallel and in a pipelined fashion;

a plurality of DACs, wherein each DAC is coupled to at least one of said SDAC circuits to receive the output DAC value from one of said plurality of SDAC circuits and each of said plurality of DACs is time interleaved; and a combiner configured to combine time interleaved outputs from said plurality of DACs.

2. The DRFM of claim 1, wherein each of said plurality of ADCs has a clock offset of 1/n times the clock rate of each said ADC, where n is the number of ADCs.

3. The DRFM of claim 2, wherein each of said plurality of DACs has a clock offset of 1/n times the clock rate of each said ADC.

4. The DRFM of claim 1, further comprising a track and hold circuit responsive within a predetermined bandwidth and configured to receive an input signal and output a buffered input signal to a corresponding ADC.

5. The DRFM of claim 1 further comprising:

a plurality of dual port memories coupled between said plurality of ADCs and said plurality of DACs.

6. The DRFM of claim 5, further comprising a technique application between each of said dual port memories and each said DAC, wherein said technique application performs at least one of time, frequency, phase, and amplitude modulation.

7. The DRFM of claim 1, wherein the plurality of DACs are configured to receive samples from said plurality of SDAC circuits at a sample rate greater than the clock rate of a host platform.

8. A method comprising:

generating a system clock signal to produce a clock input;

skewing the clock input and applying the skewed clock input to each of a plurality of analog to digital converters (ADCs) such that each ADC samples a received radio frequency (RF) signal at a time offset with respect to another ADC and each ADC defines a channel in parallel to each other channel;

capturing at each ADC, time interleaved samples;

converting said time interleaved samples to digital samples according to the channel defined by the associated ADC;

calculating, for each channel in a parallel and pipelined fashion, an input to a digital to an analog converter (DAC) by, for each parallel channel, adding a previous DAC output value, to the sum of a value of a current digital sample and a value of a previous digital sample;

converting said calculated inputs to analog samples;

outputting an analog signal based on said analog samples.

9. The method of claim 8, wherein calculating an input to a DAC is performed for a plurality of DACs.

10. The method of claim 9, wherein the number of ADCs is equal to the number of DACs.

11. The method of claim 9, wherein the number of ADCs is not equal to the number of DACs.

12. The method of claim 8, wherein each of said plurality of ADCs has a clock offset of 1/n times the clock rate of each said ADC, where n is the number of ADCs.

13. The method of claim 9, wherein each of said plurality of DACs has a clock offset of 1/n times the clock rate of each said ADC.

14. The method of claim 8, further comprising performing at least one of time, frequency, phase, and amplitude modulation on the digital samples.

15. A digital radio frequency memory (DFRM) comprising:

a splitter configured to receive and distribute a radio frequency (RF) input;

a plurality of analog to digital converters (ADCs) coupled to said splitter, each ADC defining a parallel channel and configured in a time interleaved manner such that each said ADC receives a clock signal skewed by a time period of equal fractions of each ADC's sample rate, and samples the RF input at a time offset by a given clock cycle relative to an adjacent one of said plurality of ADCs;

a plurality of SDAC circuits, each SDAC circuit coupled to the output of a corresponding one of said plurality of ADCs, and configured to receive a current processed sample from the corresponding ADC, and coupled to a digital to analog converter (DAC) to receive a value previously received by said DAC, and further coupled to an output of another one of said plurality of SDACs to receive a previous processed sample from said other SDAC, whereby the plurality of SDAC circuits are configured in a parallel and pipelined fashion; and wherein each SDAC produces an output value that updates the previous value received by the said DAC based on the current processed sample as compared with the previous processed sample; and a combiner configured to combine the time interleaved outputs from said DACs to generate an output signal representative of said RF input.

* * * * *